INVENTOR
JOHN C. MARINACE

BY Alvin J. Riddles
ATTORNEY 3,031,404

PRODUCTION OF UNIFORM HIGH IMPURITY CONCENTRATION SEMICONDUCTOR MATERIAL

John C. Marinace, Yorktown Heights, N.Y., assignor to International Business Machines Corporation, New York, N.Y., a corporation of New York Filed Dec. 3, 1959, Ser. No. 857,110
10 Claims. (Cl. 252—62.3)

Figure 1:
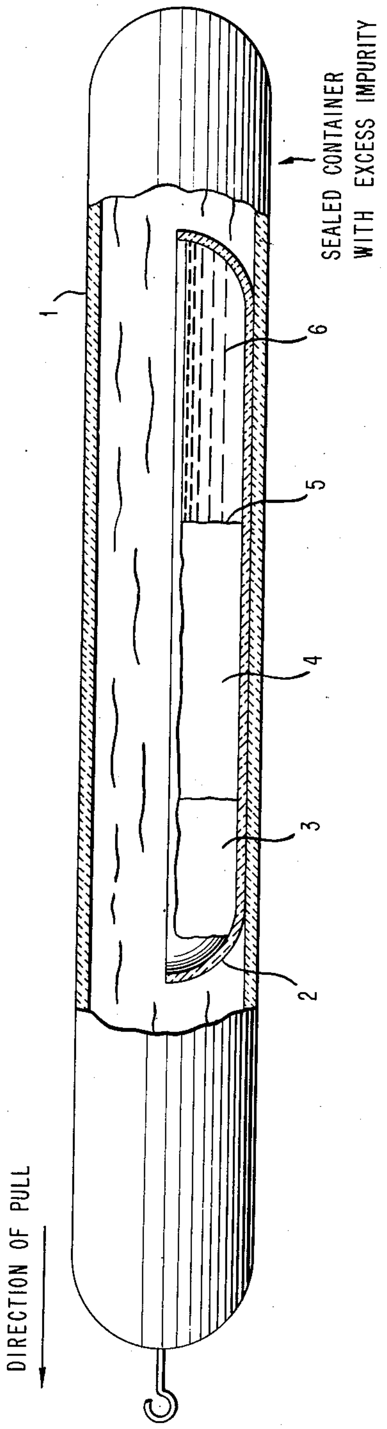

This invention relates to the formation of semiconductor materials and in particular to the introduction of very high concentrations of impurities in monocrystalline semiconductor material.

In the development of the technology associated with the semiconductor materials, a property known as degeneracy has been observed and this property lends itself to the production of special semiconductor devices. The property of degeneracy occurs when the concentration of conductivity type determining impurities in the semiconductor material is sufficiently great that the resistivity of the material is practically independent of temperature over a wide temperature range. An example of a semiconductor device employing degenerate semiconductor material is the Esaki or tunnel diode, wherein two regions of semiconductor material at least one of which is degenerate and the other at least nearly degenerate are joined at a rectifying junction. In such a device, a quantum-mechanical tunneling of carriers through an overlap section of the forbidden region occurs under the influence of forward bias. This behavior results in the device exhibiting a current-generated negative resistance in a portion of the output characteristic in the forward direction.

In order for a semiconductor material to exhibit the property of degeneracy an extremely high concentration of conductivity type determining impurities must be introduced into the crystal. The concentrations required by degeneracy are so great that the crystalline structure tends to reject the impurity so that degenerate semiconductor material has been difficult to produce heretofore in the art. This fact may be appreciated when it is considered that in one of the more extensively investigated semiconductor materials, germanium, there are $4\times10^{22}$ atoms per cubic centimeter and to impart the property of degeneracy to this material there is required a large quantity of conductivity type determining impurity. At the present state of the technology, this is in vicinity of $10^{19}$ impurities centers of the usual kind. This is in effect, the introduction of approximately 1 impurity center per 1000 crystal atoms. In addition to the tendency of the crystal to reject the high concentration of the impurities being introduced, further problems have been encountered heretofore in the art in producing degenerate semiconductor material. Because of relatively high vapor pressures, impurities such as phosphorus and arsenic, although these impurities appear to make superior devices, are not readily incorporated into semiconductor crystals to form degenerate semiconductor material when grown from a melt by ordinary means used in the art. These impurities have been introduced by sealing the semiconductor and the volatile impurity in a container. In this way heavier concentrations of impurities in a crystal have been possible because the environment within the tube may be changed to establish pressures above atmospheric conditions. The impurity is incorporated more efficiently if the coolest portion of the tube is at a higher temperature than room temperature. This technique permits the impurity to be introduced, but a problem of longitudinal uniformity of impurity distribution in the grown crystal is difficult to maintain because the principle employed in "zone refining" operates to cause the volatile impurity to segregate toward the liquid causing the liquid to contain a greater and greater quantity of impurity as the crystal growth progresses.

What has been discovered is a method of producing degenerate semiconductor material involving volatile conductivity type determining impurities wherein the quantity of degenerate semiconductor material produced is formed with a high and uniform concentration of conductivity type determining impurities throughout its volume. The high uniform concentration of conductivity type determining impurities is introduced into a semiconductor crystal in accordance with this invention through the use of a gradient freeze technique with a higher temperature region in the liquid zone of a semiconductor crystal grown within a sealed environment.

It is an object of this invention to provide an improved method of introducing volatile conductivity type determining impurities in a uniform high concentration into semiconductor material.

It is another object of this invention to provide an improved method of growing a single crystal having a uniform high concentration of conductivity type determining impurities.

It is another object of this invention to provide an improved method of producing degenerate semiconductor material.

It is still another object of this invention to provide a method of producing a single crystal of uniform impurity concentration degenerate semiconductor material.

It is still another object of this invention to provide an improved method of providing a high concentration of volatile impurities in germanium semiconductor material.

It is still another object of this invention to provide an improved method of introducing sufficient phosphorus in a crystal of germanium semiconductor material to produce degeneracy.

It is still another object of this invention to provide a method of introducing sufficient arsenic in a crystal of germanium semiconductor material to produce degeneracy.

It is still another object of this invention to provide a method of introducing a sufficient concentration of zinc in a crystal of germanium semiconductor material to produce degeneracy.

The foregoing and other objects, features and advantages of the invention will be apparent from the following more particular description of a preferred embodiment of the invention as illustrated in the accompanying drawings.

Figure 2:
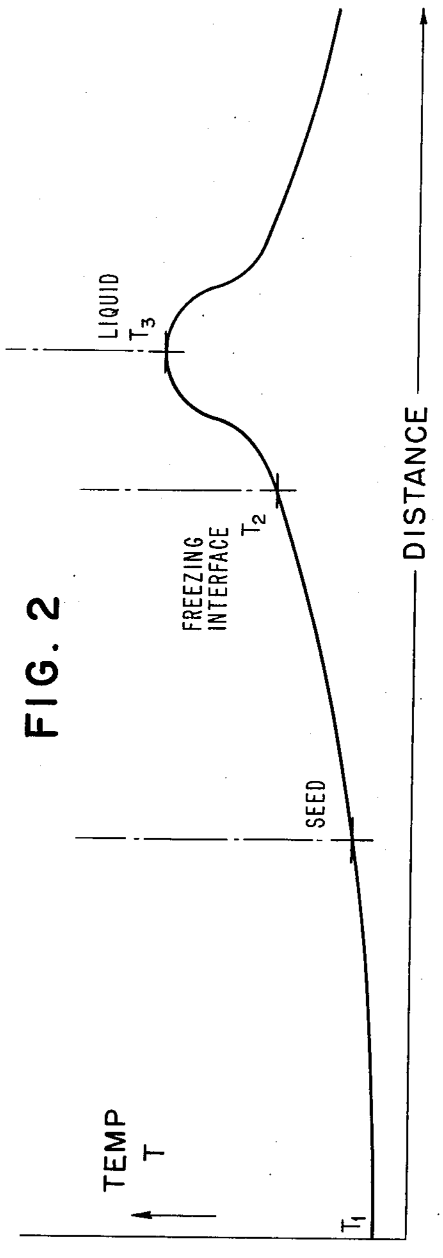

In the drawings:

FIGURE 1 is a cross-sectional view of a sealed container illustrating the conditions under which the invention is practiced and FIGURE 2 is a graph showing a gradient of temperature with distance corresponding to FIGURE 1. The introduction of a high concentration and uniform distribution of volatile conductivity type impurities in the semiconductor material is accomplished by sealing the material in an environment controlling container having a temperature profile therein such that the region of the container in which the solid material is positioned is in a lower temperature portion, the liquid-solid interface is at an intermediate portion of the container at a temperature higher than that of the solid material and at an optimum temperature for proper soldification with respect to the rate of crystal growing, and in a third region where the liquid is located a third temperature is established in the container higher than the temperature at the liquid solid interface. The higher temperature in the liquid region operates to produce an evaporation of the excess volatile impurities concentrated in the liquid as a result of the preferential segregation of these volatile impurities into the liquid from the solid as the crystal grows. Through this combination of a temperature profile and an environment controlling container, in accordance with the invention both the vapor pressure and the effect of the segregation coefficient of the volatile impurity being employed are prevented from interfering with the uniform distribution of the volatile impurities in a high concentration of semiconductor material. Under these conditions it is possible to introduce a sufficient concentration of conductivity type determining impurities in a uniform distribution to provide a quantity of degenerate semiconductor material large enough to make a number of devices.

Referring now to FIGURE 1, an environment controlling container such as a sealed quartz tube 1 is provided in which a charge containing element 2 is positioned. The element 2 may be, for example, a boat of graphite or silica filmed with graphite. The crystal growing operation is shown as being in progress for purposes of illustration. The boat 2 contains in one portion a seed crystal 3, a region of solid monocrystalline semiconductor material 4, a liquid-solid freezing interface 5, and a region of liquid semiconductor material 6.

A heating source is applied to the tube such that individual portions thereof may be established at different temperatures. This may conveniently be done by placing heating coils, not shown, around individual portions of the tube and controlling the power applied to each coil. Initially sufficient temperature is applied to the portion of the tube 1 containing the boat 2 to render the germanium including a small part of the seed crystal 3 liquid. The temperature in the region of the seed crystal 3 is then reduced and motion with respect to the temperature zone is provided to the tube. The direction of motion is such that monocrystalline semiconductor material 4 segregates from the liquid and grows on the seed crystal 3. The direction of the motion is shown in FIGURE 1 by an arrow and in the intermediate stage of the operation as is illustrated, a portion of the solid monocrystalline material 4 and a freezing interface 5 separating the liquid semiconductor material 6 from the seed crystal 3 are pictured.

In accordance with the invention, the above described conditions are the result of the setting up of a temperature profile in the environment controlling container. The temperature profile is such that referring to FIGURE 2, a temperature $T_1$ lower than the melting point temperature of the semiconductor material is established in a portion of the container 1. A temperature $T_2$ is set up in the region of the freezing interface. The temperature $T_2$ is determined by the melting point of the semiconductor material. A temperature $T_3$ is set up in the region of the liquid semiconductor material; this $T_3$ is determined by the volatility of the conductivity type determining impurity and growth rate of the crystal. Under this temperature profile, as the crystal 4 grows, due to the travel of the elements under the heat zones, the volatile impurity as a result of the selected higher temperature in the region of the liquid is caused to evaporate off at the rate at which that volatile impurity tends to increase its concentration in the liquid due to a preference for the liquid over the solid. As examples, the volatile impurities may be the elements arsenic, phosphorus and zinc.

It should be noted that the advantage in the providing of the increased temperature in the liquid region is more than merely a matter of overriding the effect of increased concentration of impurity in the liquid as growth progresses and thereby providing a uniform rate. As has been previously mentioned, degenerate semiconductor material, contains a concentration of conductivity type determining impurities that is so near maximum quantity of conductivity type determining impurities that can be introduced into the crystal and still maintain the crystalline periodicity, that the crystal, in the growing operation, when the concentration of the impurity in the liquid increases as it does due to the preference of the impurity for the liquid state rejects this increase in concentration of impurity in the solid by forming solid inclusions and thereby losing the monocrystalline state of the material.

In order to aid in understanding and to provide a starting point for one skilled in the art in practicing the invention, there is provided the following set of specifications for the uniform introduction of sufficiently high concentrations of conductivity determining impurities in semiconductor materials to produce degeneracy. It should be understood that no limitation should be construed hereby since many such sets of specifications may be provided by one skilled in the art in the light of the accompanying disclosure. It should further be pointed out that the following specifications set forth only the essential criteria with respect to the invention and that in the complex and highly detailed technology of semiconductor devices, high degrees of purity with respect to particular materials are required and efforts should be directed to the preserving of these degrees of purity.

Typical specific data—

Pull rate: ⅓ inch/hour. (111) Crystallographic direction.

Boat size: 10" long, semicircular cross section, radius 8 mm.

Charge: Zone, refined approximately 40 ohm centimeter resistivity polycrystalline approximately 200 grams germanium (not critical) plus approximately ½ to 1 gram phosphorus.

Temperatures of $T_1$, $T_2$, and $T_3$: $T_1=25\pm3°$ C., $T_2=936\pm10°$ C., $T_3=1100\pm25°$ C.

In a ten inch monocrystalline ingot growing according to the above specifications resistivity measured by four point resistivity probing and checked by Hall effect measurements was constant between 0.001 and 0.0009 ohm centimeter over the first 8 inches of the ingot.

What has been described is a method of the uniform introduction of very high concentrations of volatile impurities in semiconductor materials, in which the orders of magnitude involved are approximately one conductivity type determining impurity center per one thousand crystal atoms, wherein a temperature profile is set up in a sealed container involving a seed crystal and a freezing interface such that the seed crystal is at the lower portion of the temperature profile the freezing interface is at the optimum intermediate temperature of the temperature profile for crystal growth and a high temperature point is set up in the liquid such that the excess of conductivity type determining impurity swept into the liquid by the preference of the impurity for the liquid is maintained in equilibrium by evaporation out of the liquid at the higher temperature.

While there has been shown and described and pointed out the fundamental novel features of the invention as applied to a preferred embodiment, it will be understood that various omissions and substitutions and changes in form and details of the device illustrated and in its operation may be made by those skilled in the art without departing from the spirit of the invention. It is the intention therefore, to be limited only as indicated by the scope of the following claims.

What is claimed is:

1. A method for the uniform introduction of sufficiently high concentrations of volatile conductivity type determining impurities to produce degenerate semiconductor material comprising the steps of providing a progressive monocrystalline solidification of a quantity of semiconductor material on a seed crystal from a liquid containing a conductivity type determining impurity in the presence of a vapor containing said conductivity type determining impurity, and maintaining, during said progressive solidification, environmental conditions for said progressive solidification such that the seed crystal and the solidified semiconductor material is maintained at a temperature less than the melting temperature of said semiconductor material, the freezing interface between said solidified semiconductor material is maintained at a temperature in the vicinity of the melting temperature of said semiconductor material optimum for crystal growth and the liquid semiconductor material is maintained at a temperature governed by the environmental pressure and crystalline growth rate such that a uniform specific concentration of said conductivity type determining impurity is maintained in the liquid as the volume of said liquid semiconductor material decreases.

2. A method for the uniform introduction of sufficiently high concentrations of volatile conductivity type determining impurities to produce degenerate germanium semiconductor material comprising the steps of providing in a sealed container a progressive monocrystalline solidification of a quantity of germanium on a seed crystal from a liquid containing a conductivity type determining impurity in the presence of a vapor containing said conductivity type determining impurity and maintaining during said progressive solidification environmental conditions for said progressive solidification such that a portion of said container is maintained at a temperature less than the melting temperature of said germanium, the freezing interface between the liquid and the solidified germanium is maintained at a temperature in the vicinity of the melting temperature of said germanium optimum for crystal growth and the liquid germanium is maintained at a temperature governed by the environment pressure and crystalline growth rate such that a uniform specific concentration of said conductivity type determining impurity is maintained in the liquid as the volume of said liquid germanium decreases.

3. A method for the uniform introduction of sufficiently high concentrations of volatile conductivity type determining impurities to produce degenerate germanium semiconductor material comprising the steps of providing a progressive monocrystalline solidification of a quantity of germanium on a germanium seed crystal from a liquid of germanium material containing arsenic as a conductivity type determining impurity in the presence of a vapor containing said arsenic, maintaining temperature conditions during said progressive solidification such that the seed crystal and the solidified germanium is maintained at a temperature less than the melting temperature of said germanium, the freezing interface between said solidified germanium and the liquid germanium is maintained at a temperature in the vicinity of the melting temperature of said germanium optimum for crystal growth and the liquid germanium is maintained at a temperature governed by the environmental pressure and crystalline growth rate such that a uniform specific concentration of said arsenic conductivity type determining impurity is maintained in the liquid as the volume of said liquid germanium decreases.

4. A method for the uniform introduction of sufficiently high concentration of volatile conductivity type determining impurities to produce degenerate germanium comprising the steps of providing a progressive monocrystalline solidification of a quantity of germanium on a germanium seed crystal from a liquid of germanium containing phosphorus as a conductivity type determining impurity in the presence of a vapor containing said phosphorus, and maintaining temperature conditions during said progressive solidification such that the seed crystal and the solidified germanium is maintained at a temperature less than the melting temperature of said germanium, the freezing interface between said solidified germanium is maintained at a temperature in the vicinity of the melting temperature of said germanium optimum for crystal growth and the liquid germanium is maintained at a temperature governed by the environmental pressure and crystalline growth rate such that a uniform specific concentration of said phosphorus conductivity type determining impurity is maintained in the liquid as the volume of said liquid germanium decreases.

5. A method for the uniform introduction of sufficiently high concentrations of volatile conductivity type determining impurities to produce degenerate germanium semiconductor material comprising the steps of providing a progressive monocrystalline solidification of a quantity of germanium on a germanium seed crystal from a liquid of germanium containing zinc as a conductivity type determining impurity in the presence of a vapor containing said zinc and maintaining during said progressive solidification environmental conditions for said progressive solidification such that the seed crystal and the solidified germanium is maintained at a temperature less than the melting temperature of said germanium material, the freezing interface between said solidified germanium and said liquid germanium is maintained at a temperature in the vicinity of the melting temperature of said germanium optimum for crystal growth, and the liquid germanium is maintained at a temperature governed by the environmental pressure and crystalline growth rate such that a uniform specific concentration of said zinc conductivity type determining impurity is maintained in the liquid as the volume of said liquid germanium decreases.

6. The process of introducing a sufficiently high concentration of uniformly distributed conductivity type determining impurities into semiconductor material to produce degeneracy comprising the steps of providing a sealed environment controlling container; positioning a linearly disposed quantity of semiconductor material including a particular conductivity type determining impurity within said container; providing a seed crystal of said semiconductor material in contact with one extreme of said linearly disposed quantity of semiconductor material; providing an excess of said particular conductivity type determining impurity in an environment within said container; establishing a temperature gradient within said container such that said seed crystal is at the lowest temperature, that a freezing interface between a solidified portion and a liquid portion of said semiconductor material is maintained at an intermediate temperature optimum for crystal growth, and that said liquid portion of said semiconductor material containing said conductivity type determining impurity, is at a higher temperature sufficient to maintain a high specific impurity concentration in the liquid by balancing the increase in impurity concentration in the liquid due to a preference of said impurity for the liquid with a decrease in impurity concentration in the liquid due to evaporation in the said environment; and imparting motion to said seed crystal and said semiconductor material such that said freezing interface progresses through said linearly disposed semiconductor material in a direction away from said seed crystal.

7. The process of introducing a sufficiently high concentration of uniformly distributed conductivity type determining impurities into germanium semiconductor material to produce degeneracy comprising the steps of providing a sealed environment controlling container; positioning a linearly disposed quantity of germanium within said container; providing a seed crystal of germanium including a particular conductivity type determining impurity in contact with one extreme of said linearly disposed quantity of germanium; providing an excess of said particular conductivity type determining impurity in an environment within said container; establishing a temperature gradient within said container such that said seed crystal is at the lowest temperature that a freezing interface between a solidified portion and a liquid portion of said linearly disposed germanium is maintained at an intermediate temperature optimum for crystal growth, and that said liquid portion of said germanium containing said conductivity type determining impurity, is at a higher temperature sufficent to maintain a high specific impurity concentration in the liquid by balancing the increase in impurity concentration in the liquid due to a preference of said impurity concentration in the liquid due to evaporation in the said environment; and imparting motion to said seed crystal and said linearly disposed germanium such that said freezing interface progresses through said germanium in a direction away from said seed crystal.

8. The process of introducing sufficiently high concentrations of uniformly distributed arsenic into germanium semiconductor material to produce degeneracy comprising the steps of providing a sealed environment controlling container; positioning a linearly disposed quantity of germanium containing arsenic as a conductivity type determining impurity within said container; providing a seed crystal of said germanium in contact with one extreme of said linearly disposed quanity of germanium; providing an excess of arsenic in an environment within said container; establishing a temperature gradient within said container such that said seed crystal is at the lowest temperature, that a freezing interface between a solidified portion and a liquid portion of said linearly disposed germanium is maintained at an intermediate temperature optimum for crystal growth, and that said liquid portion of said germanium containing said arsenic is at a higher temperature sufficient to maintain a high specific arsenic concentration in the liquid by balancing the increase in arsenic concentration in the liquid due to the preference of said arsenic for the liquid with a decrease in arsenic concentration in the liquid due to evaporation of said arsenic into said environment; and imparting motion to said seed crystal and said germanium such that said freezing interface progresses through said germanium in a direction away from said seed crystal.

9. The pocess of introducing sufficiently high concentrations of uniformly distributed phosphorus into germanium semiconductor material to produce degeneracy comprising the steps of providing a sealed environment controlling container; positioning a linearly disposed quantity of germanium including said phosphorus as a conductivity type determining impurity within said container; providing a seed crystal of said germanium in contact with one extreme of said linearly disposed quantity of germanium; providing an excess of said phosphorus in an environment within said container; establishing a temperature gradient within said container such that said seed crystal is at the lowest temperature, that a freezing interface between a solidified portion and a liquid portion of said germanium is maintained at an intermediate temperature optimum for crystal growth, and that said liquid portion of said germanium containing said phosphorus is at a higher temperature sufficient to maintain a high specific phosphorus concentration in the liquid by balancing the increase in phosphorus concentration in the liquid due to the preference of said phosphorus for the liquid with a decrease in phosphorus concentration in the liquid due to evaporation of said phosphorus into said environment; and imparting motion to said seed crystal and said germanium such that a freezing interface progresses through said germanium in a direction away from said seed crystal.

10. The process of introducing sufficiently high concentrations of uniformly distributed zinc into germanium semiconductor material to produce degeneracy comprising the steps of providing a sealed environment controlling container; positioning a linearly disposed quantity of germanium including zinc as a conductivity type determining impurity within said container; providing a seed crystal of said germanium in contact with one extreme of said linearly disposed quantity of germanium; providing an excess of said zinc in an environment within said container; establishing a temperature gradient within said container such that said seed crystal is at the lowest temperature, that a freezing interface between a solidified portion and a liquid portion of said germanium is maintained at an intermediate temperature optimum for crystal growth and that said liquid portion of said germanium containing said zinc is at a higher temperature sufficient to maintain a high specific zinc concentration in the liquid by balancing the increase in zinc concentration in the liquid due to the preference of said zinc for the liquid with a decrease in zinc concentration in the liquid due to evaporation of said zinc into said environment; and imparting motion to said seed crystal and said germanium such that a freezing interface progresses through said germanium in a direction away from said seed crystal.

References Cited in the file of this patent

UNITED STATES PATENTS

| | | |
|---|---|---|
| 2,809,165 | Jenny | Oct. 8, 1957 |
| 2,898,249 | Jenser | Aug. 4, 1959 |
| 2,904,512 | Horn | Sept. 15, 1959 |
| 2,935,478 | Bradshaw et al. | May 3, 1960 |

UNITED STATES PATENT OFFICE
CERTIFICATE OF CORRECTION

Patent No. 3,031,404 April 24, 1962

John C. Marinace

It is hereby certified that error appears in the above numbered patent requiring correction and that the said Letters Patent should read as corrected below.

Column 3, line 70, after "near" insert -- the --; column 6, lines 59 and 60, strike out "including a particular conductivity type determining impurity" and insert the same after "germanium" in line 57, same column 6.

Signed and sealed this 16th day of October 1962.

(SEAL)
Attest:

ERNEST W. SWIDER
Attesting Officer

DAVID L. LADD
Commissioner of Patents